United States Patent
Matsushita

(10) Patent No.: US 8,133,776 B2
(45) Date of Patent: Mar. 13, 2012

(54) SEMICONDUCTOR DEVICE AND FABRICATION METHOD FOR THE SAME

(75) Inventor: Keiichi Matsushita, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 266 days.

(21) Appl. No.: 12/417,156

(22) Filed: Apr. 2, 2009

(65) Prior Publication Data

US 2010/0052014 A1  Mar. 4, 2010

(30) Foreign Application Priority Data

Sep. 3, 2008  (JP) ................................ 2008-226246
Sep. 3, 2008  (JP) ................................ 2008-226248

(51) Int. Cl.
*H01L 21/336* (2006.01)

(52) U.S. Cl. ........ 438/197; 438/167; 438/183; 438/184; 438/285; 257/76; 257/85; 257/192; 257/194; 257/E21.407

(58) Field of Classification Search .................. None
See application file for complete search history.

(56) References Cited

U.S. PATENT DOCUMENTS

| | | | |
|---|---|---|---|
| 2003/0151063 A1 | 8/2003 | Kobayashi | |
| 2006/0273347 A1* | 12/2006 | Hikita et al. | ................ 257/192 |
| 2006/0292833 A1 | 12/2006 | Matsushita | |

FOREIGN PATENT DOCUMENTS

| | | |
|---|---|---|
| EP | 2 073 264 A1 | 6/2009 |
| JP | 53-8572 | 1/1978 |
| JP | 5-308082 | 11/1993 |
| JP | 2000-164605 | 6/2000 |
| JP | 2002-141498 | 5/2002 |
| JP | 2002-141499 | 5/2002 |
| JP | 2004-95640 | 3/2004 |
| JP | 2006-66887 | 3/2006 |
| JP | 2006-156914 | 6/2006 |
| JP | 2006-261252 | 9/2006 |
| JP | 2007-184379 | 7/2007 |
| JP | 2007-221001 | 8/2007 |
| WO | WO 2008/041682 A1 | 4/2008 |

OTHER PUBLICATIONS

Office Action issued Jan. 4, 2011 in Japan Application No. 2008-226248 (With English Translation).

* cited by examiner

*Primary Examiner* — N Drew Richards
*Assistant Examiner* — Kyoung Lee
(74) *Attorney, Agent, or Firm* — Oblon, Spivak, McClelland, Maier & Neustadt, L.L.P.

(57) ABSTRACT

A semiconductor device includes a substrate; a nitride based compound semiconductor layer placed on the substrate; an active area which is placed on the nitride based compound semiconductor layer, and is composed of an aluminum gallium nitride layer ($Al_xGa_{1-x}N$) (where $0.1<=x<=1$); an isolation region which performs isolation of the active area mutually; a gate electrode, a source electrode, and a drain electrode which have been placed on the active area surrounded by the isolation region; and a trench region formed by etching for a part of the active area under the gate electrode. The semiconductor device is highly reliable, high performance and high power and a fabrication method for the same is also provided.

8 Claims, 14 Drawing Sheets

SEMICONDUCTOR DEVICE AND FABRICATION METHOD FOR THE SAME

CROSS REFERENCE TO RELATED APPLICATIONS AND INCORPORATION BY REFERENCE

This application is based upon and claims the benefit of priority from prior Japanese Patent Applications No. P2008-226246 filed on Sep. 3, 2008 and No. P2008-226248 filed on Sep. 3, 2008, the entire contents of which are incorporated herein by reference.

TECHNICAL FIELD

The present invention relates to a semiconductor device and a fabrication method for the same. In particular, the present invention relates to a semiconductor device for highly reliable and high power, which composes gallium nitride (GaN) etc., and a fabrication method for the same.

BACKGROUND ART

It is known that an FET (Field Effect Transistor) using a gallium nitride (GaN) based semiconductor has large current collapse and large leakage current. The crystal dislocation and crystal defect, which are one of the causes in an epitaxial crystal are mentioned.

Since the crystal defects degrades fundamental performances of the GaN based FETs, such as increase of leakage current, and generating of a current collapse phenomenon, it is dramatically important to obtain an epitaxial layer with little crystal defects.

In order to decrease the crystal dislocation and the crystal defect of a GaN epitaxial layer, inserting an aluminum gallium nitride (AlGaN) layer and an aluminum nitride (AlN) layer into a GaN layer is known.

As shown in FIG. 1, the configuration of the basic unit of the conventional high power semiconductor device, which is composed of a gallium nitride layer, an aluminum gallium nitride (AlGaN) layer, etc. includes a GaN layer 12 placed on the substrate 10 which is composed of SiC; an AlGaN layer 14 placed on the GaN layer 12; and a gate electrode 24, a source electrode 20, and a drain electrode 22 which are placed on the AlGaN layer 14.

Furthermore, as shown in FIG. 1, as for the conventional semiconductor device, the isolation region acting as a non-active area NA is formed in the periphery of an active area AA which is composed of the AlGaN layer 14, by using mesa etching technology, ion implantation technology, etc.

As shown in FIG. 1, the gate electrode 24, the source electrode 20, and the drain electrode 22 are connected to a gate terminal electrode 240, a source terminal electrode 200, and a drain terminal electrode 220 which are placed on the isolation region acting as the non-active area NA, respectively.

FIG. 2 shows a schematic section structure taken in the line I-I of FIG. 1, and is an example in which an isolation region 25 which acts as the non-active area NA in the periphery of the active area AA by mesa etching technology is formed. A source electrode contact 20a is placed between the source electrode 20 and the AlGaN layer 14, and a drain electrode contact 22a is placed between the drain electrode 22 and the AlGaN layer 14.

That is, as shown in FIG. 2, the isolation region 25 is formed by mesa etching of a part of the AlGaN layer 14 and the GaN layer 12 in the periphery of the AA area of the conventional semiconductor device. The active area AA of the semiconductor device is specified by the isolation region 25 formed by mesa etching. In addition, an insulating layer 30 acting as a passivation film is formed on the sidewall part of the isolation region 25 formed by mesa etching and the active area, as shown in FIG. 2.

As shown in FIG. 1, the conventional semiconductor device is electrically insulated between the gate and the drain by the isolation region acting as the non-active area NA except for the active area AA. For this reason, originally, an amount of surface leakage current does not flow between the gate and the drain on the isolation regions except for the active area AA.

However, when a great value of voltage is applied between the gate and drain, an electric field concentrates on the gate electrode tip region GP between the gate electrode 24 and the drain terminal electrode 220. For this reason, an amount of surface leakage current flows between the gate electrode 24 and the drain terminal electrode 220, and the characteristic degradation of a semiconductor device is caused. There is a problem of resulting in the breakdown of a semiconductor device depending on the case.

For example, since GaN and AlGaN or AlN have large lattice constant difference, and electric charges induced by piezoelectric polarization effect are generated between a GaN layer 12 and an AlGaN layer 14, there is problem that the electric charges generated in the GaN layer 12 will degrade a high frequency performance of a semiconductor device extremely.

The electric charges induced by such piezoelectric polarization effect becomes the cause of increasing the conductivity of the GaN layer 12, increasing leakage current between a gate electrode 24 and a source electrode 20 or between a gate electrode 24 and a drain electrode 22, and reducing the power amplification gain of a semiconductor device.

A field effect transistor using the GaN based semiconductor which can form a gate size in 0.1 micrometer class, and is not occurred leakage current between a gate electrode and a source electrode or a drain electrode, and a fabrication method for the same, are already disclosed (for example, refer to Patent Literature 1). In the Patent Literature 1, the gate leakage current is reduced by using the field effect transistor having a gate electrode in which the sectional shape is T shape.

Moreover, a high resistivity group III nitride semiconductor crystal, the group III nitride semiconductor substrate, and the semiconductor device, and a fabrication method of the group III nitride semiconductor crystal, are already disclosed (for example, refer to Patent Literature 2). In the Patent Literature 2, the Fe doped GaN layer, which is the group III nitride semiconductor crystal in which Fe is doped as transition metals, for example, and whose Ga atom vacancy density is not more than $1 \times 10^{16}$ cm$^{-3}$ is disclosed. The Fe atoms density of the Fe doped GaN layer is $5 \times 10^{17}$ cm$^{-3}$ to $5 \times 10^{20}$ cm$^{-3}$. Moreover, a semiconductor device which has the semiconductor layer formed on the group III nitride semiconductor substrate which is composed of the above-mentioned Fe doped GaN layer is also disclosed.

Moreover, it is already disclosed also about a semiconductor element which can perform multilayer formation of a plurality of nitride based compound semiconductor layers which have a difference of the lattice constant more than a predetermined value in the effective crystalline state, and can suppress propagation of the threading dislocations to an epitaxial growth direction (for example, refer to Patent Literature 3).

In the high power semiconductor device which is composed of a GaN layer, an AlGaN layer, etc., when electrical isolation is performed by the ion implantation (implanted isolation) technology, there is a problem that the reliability of the power semiconductor device decreases to a low value.

On the other hand, in the high power semiconductor device which is composed a GaN layer, an AlGaN layer, etc., since a step is made to a device in the electrical isolation method by mesa etching, there is a problem that a focus becomes difficult to match when forming wiring etc. with an exposure device, and it becomes difficult to perform a miniaturization.

CITATION LIST

Patent Literature 1: Japanese Patent Application Laying-Open Publication No. 2002-141499
Patent Literature 2: Japanese Patent Application Laying-Open Publication No. 2007-184379
Patent Literature 3: Japanese Patent Application Laying-Open Publication No. 2007-221001

SUMMARY OF THE INVENTION

Technical Problem

The purpose of the invention is to provide a semiconductor device in which it is high reliable, high performance, and high power and a fabrication method for the same.

Solution to Problem

According to an aspect of the invention, a nitride based semiconductor device comprises a substrate; a nitride based compound semiconductor layer placed on the substrate; an active area which is placed on the nitride based compound semiconductor layer, and is composed of an aluminum gallium nitride layer ($Al_xGa_{1-x}N$) (where $0.1<=x<=1$); an isolation region which performs isolation of the active area mutually; a trench region formed by etching for a part of previous arrangement to a gate electrode; and a gate electrode, a source electrode, and a drain electrode which are placed on the active area surrounded by the isolation region, wherein the trench region is formed including a part of the active area near the gate electrode, in the tip region of said gate electrode.

According to another aspect of the invention, a nitride based semiconductor device comprises a substrate; a nitride based compound semiconductor layer placed on the substrate; an active area which is placed on the nitride based compound semiconductor layer, and is composed of an aluminum gallium nitride layer ($Al_xGa_{1-x}N$) (where $0.1<=x<=1$); an isolation region which performs isolation of the active area mutually; a gate electrode, a source electrode, and a drain electrode which have been placed on the active area surrounded by the isolation region; a gate terminal electrode, a source terminal electrode, and a drain terminal electrode which is placed on the isolation region and is connected to the gate electrode, the source electrode, and the drain electrode, respectively; and a trench region formed between the gate electrode and the drain terminal electrode.

According to another aspect of the invention, a fabrication method for a nitride based semiconductor device comprises forming a nitride based compound semiconductor layer on a substrate; forming an active area composed of an aluminum gallium nitride layer ($Al_xGa_{1-x}N$) (where $0.1<=x<=1$) on the nitride based compound semiconductor layer; forming an isolation region which performs isolation of the active area mutually; etching a part of previous arrangement part of a gate electrode, and forming a trench region; and forming a gate electrode, a source electrode, and a drain electrode on the active area surrounded by the isolation region, wherein in the step of forming the trench region, the trench region is formed including the a part of active area near the gate electrode, in the tip region of the gate electrode.

According to another aspect of the invention, a fabrication method for a nitride based semiconductor device comprises forming a nitride based compound semiconductor layer on a substrate; forming an active area composed of an aluminum gallium nitride layer ($Al_xGa_{1-x}N$) (where $0.1<=x<=1$) on the nitride based compound semiconductor layer; forming an isolation region which performs isolation of the active area mutually; etching a part of previous arrangement part of a gate electrode having a plurality of fingers, and forming a trench region; forming a gate electrode, a source electrode, and a drain electrode which have a plurality of fingers, respectively on a first surface of the active area surrounded by the isolation region; and forming a gate terminal electrode, a source terminal electrode, and a drain terminal electrode which govern a plurality of fingers, respectively and are formed on the first surface of the substrate for every the gate electrode, the source electrode, and the drain electrode.

According to another aspect of the invention, a fabrication method for a nitride based semiconductor device comprises forming a nitride based compound semiconductor layer on a substrate; forming an active area which is composed of an aluminum gallium nitride layer ($Al_xGa_{1-x}N$) (where $0.1<=x<=1$) on the nitride based compound semiconductor layer; forming an isolation region which performs isolation of the active area mutually; forming a gate electrode, a source electrode, and a drain electrode on the active area surrounded by the isolation region; forming a gate terminal electrode, a source terminal electrode, and a drain terminal electrode which are connected to the gate electrode, the source electrode, and the drain electrode, respectively on the isolation region; and forming a trench region between the gate electrode and the drain terminal electrode.

Advantageous Effects of Invention

According to the present invention, the semiconductor device for high reliable, high performance and high power and the fabrication method for the same can be provided.

DESCRIPTION OF EMBODIMENTS

Figure 1:
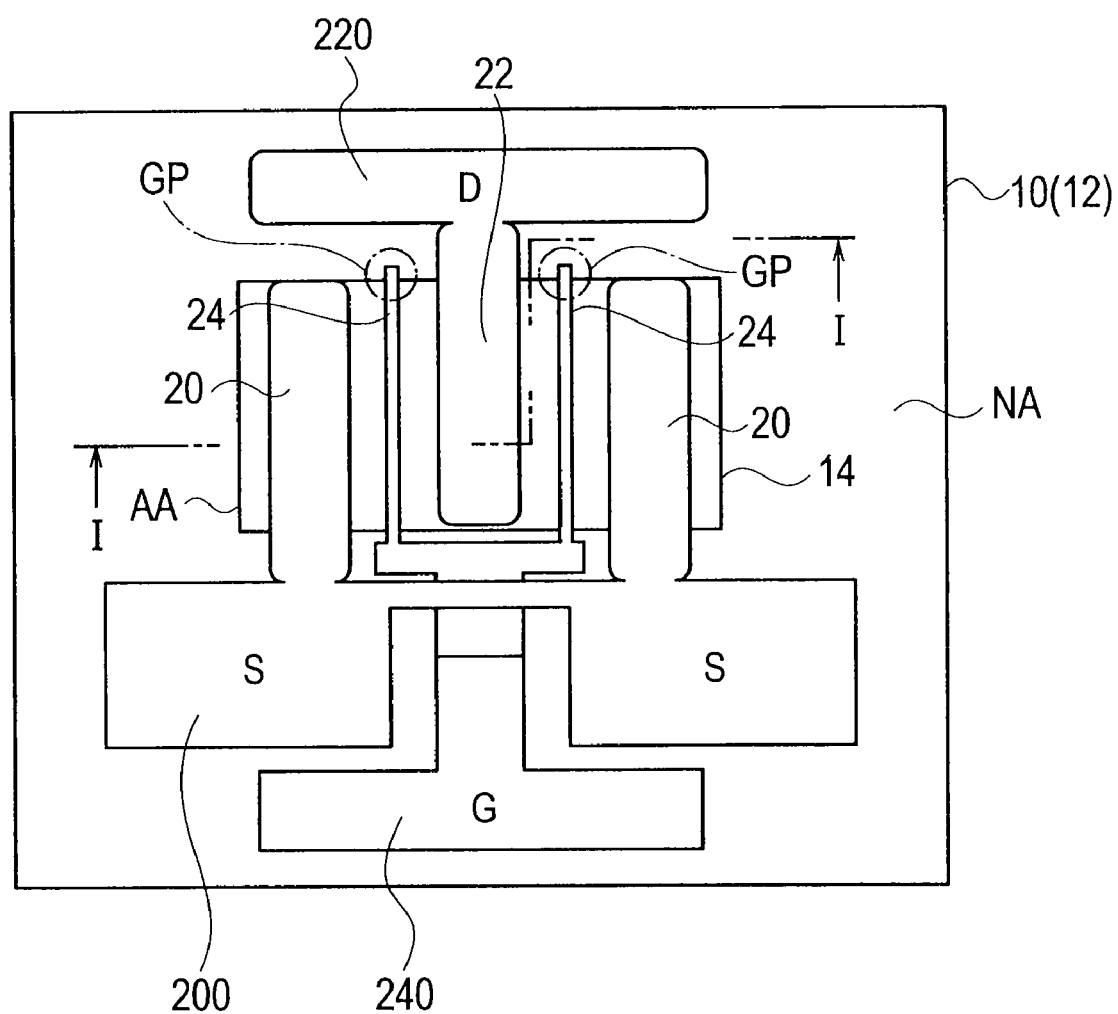
FIG. 1 is a schematic plane pattern configuration diagram of a semiconductor device according to a conventional example.
Figure 2:
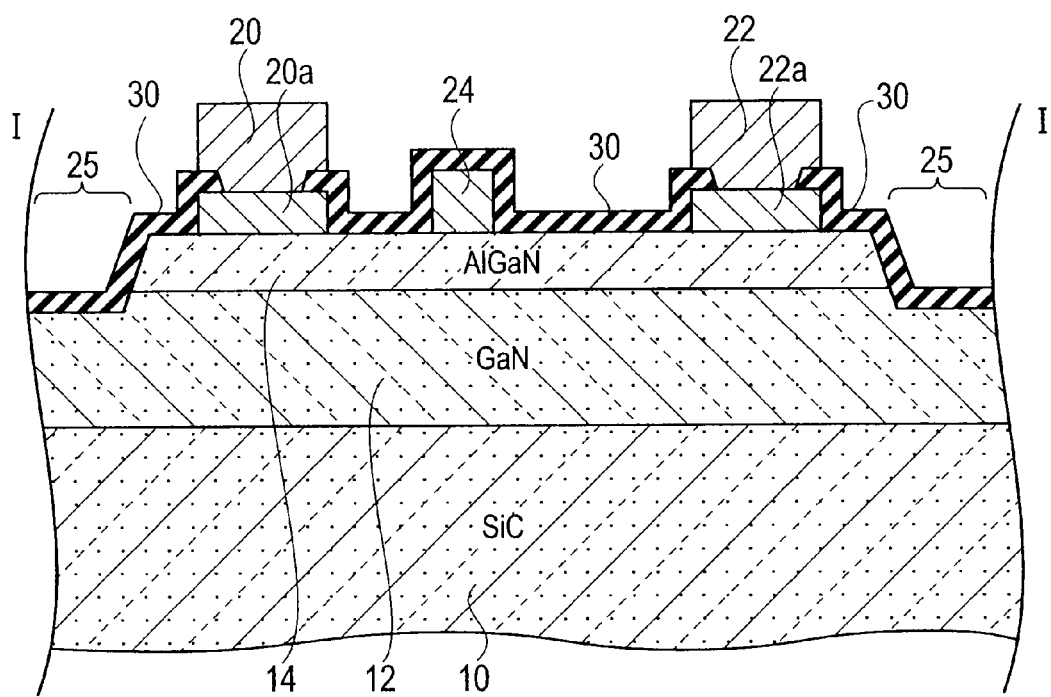
FIG. 2 is a schematic cross-sectional configuration chart taken in the line I-I of FIG. 1.

There will be described embodiments of the present invention, with reference to the drawings, where like members or elements are designated by like reference characters to eliminate redundancy, and some layers and their subsidiary regions are designated by the same reference characters for simplicity. Drawings are schematic, not actual, and may be inconsistent in between in scale, ratio, etc.

The embodiments to be described are embodiments of a technical concept or spirit of the present invention that is not limited to embodied specifics, and may be changed without departing from the spirit or scope of claims.

First Embodiment (Element Structure)

Figure 3:
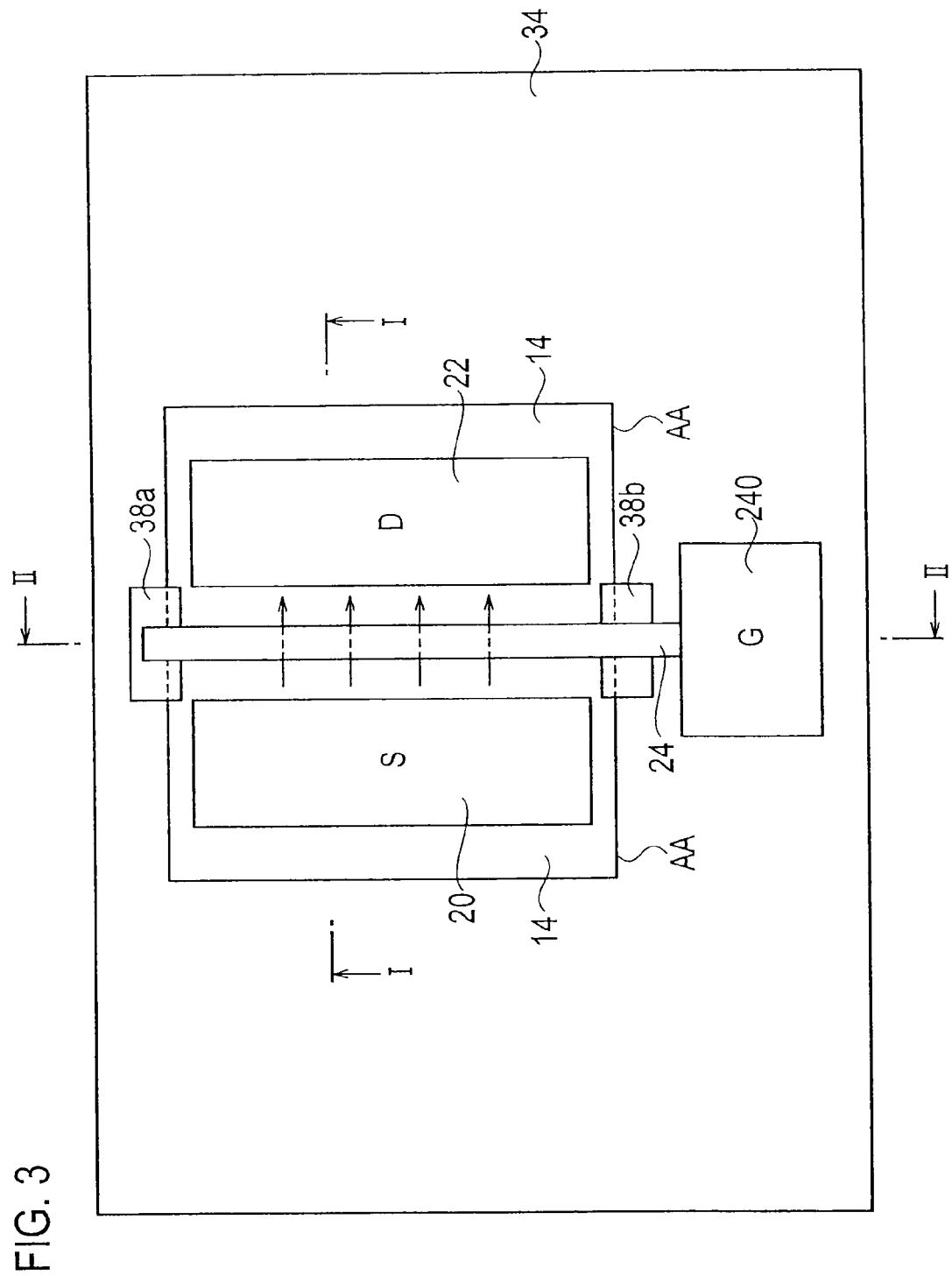
FIG. 3 is a schematic plane pattern configuration diagram of a semiconductor device according to a first embodiment of the present invention.

A schematic plane pattern configuration of a semiconductor device according to a first embodiment of the present invention is expressed as shown in FIG. 3. Moreover, a schematic section structure taken in the line I-I of FIG. 3 is expressed as shown in FIG. 4, and a schematic section structure taken in the line II-II of FIG. 3 is expressed as shown in FIG. 5.

Figure 4:
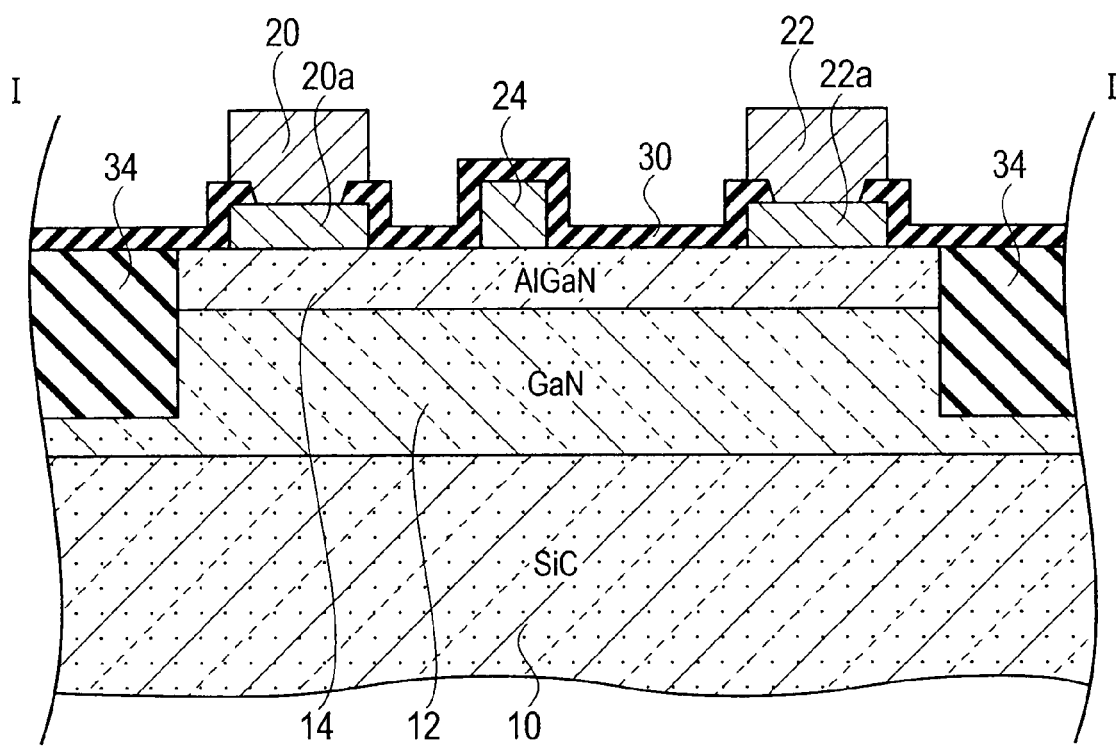
FIG. 4 shows the semiconductor device according to the first embodiment of the present invention, and is a schematic cross-sectional configuration chart taken in the line I-I of FIG. 3.
Figure 5:
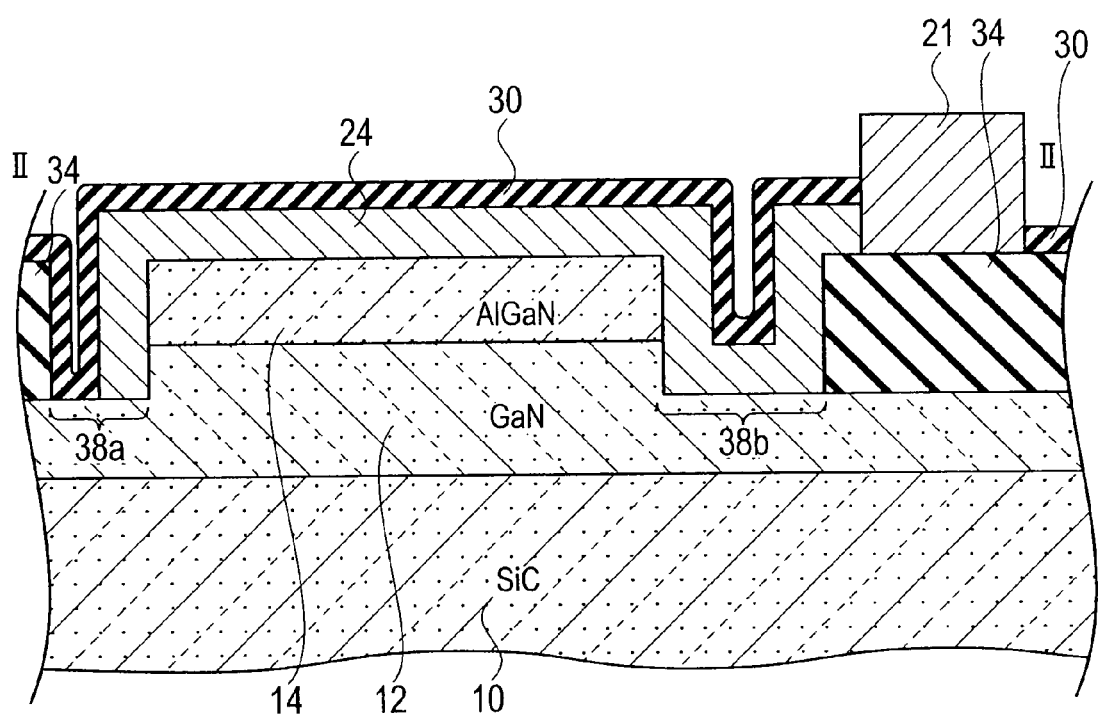
FIG. 5 shows the semiconductor device according to the first embodiment of the present invention, and is a schematic cross-sectional configuration chart taken in the line II-II of FIG. 3.

As shown in FIG. 3 to FIG. 5, the semiconductor device according to the first embodiment includes a substrate 10; a nitride based compound semiconductor layer 12 placed on the substrate 10; an active area AA which is placed on the nitride based compound semiconductor layer 12, and is composed of the aluminum gallium nitride layer ($Al_xGa_{1-x}N$) (where $0.1<=x<=1$) 14; an isolation region 34 which performs isolation of the active area AA mutually; a trench region 28a formed by etching for a part of previous arrangement to the gate electrode 24; and a gate electrode 24, a source electrode 20, and a drain electrode 22 which are placed on the active area AA surrounded by the isolation region 34.

The isolation region 34 is formed to a part of depth direction of the aluminum gallium nitride layer ($Al_xGa_{1-x}N$) (where $0.1<=x<=1$) 14 and the nitride based compound semiconductor layer 12.

In the tip region of the gate electrode 24, the trench region 28a is formed including a part of the active area near the gate electrode 24, as shown in FIG. 5.

Furthermore, as shown in FIG. 3 and FIG. 5, a gate terminal electrode 240 which is connected to the gate electrode 24 and is placed on the isolation region 34 may be further included, and the trench region 28b may be formed including a part of the active area AA between the gate electrode 24 and the gate terminal electrode 240.

The isolation region 34 is formed of ion implantation. As ion species, nitrogen (N), argon (Ar), etc. are applicable, for example. Moreover, the amount dosage accompanying the ion implantation is about $1\times10^{14}$ (ions/cm$^2$), for example, and accelerating energy is about 100 keV to about 200 keV.

The insulating layer 30 for passivation is formed on the isolation region 34 and the device surface. As this insulating layer 30, it can form with a nitride film, an alumina ($Al_2O_3$) film, an oxide film ($SiO_2$), an oxy-nitride film (SiON), etc. deposited by the PECVD (Plasma Enhanced Chemical Vapor Deposition) method, for example.

A source electrode contact 20a is formed on the interface between the source electrode 20 and the aluminum gallium nitride layer ($Al_xGa_{1-x}N$) (where $0.1<=x<=1$) 14, and a drain electrode contact 22a is formed on the interface between the drain electrode 22 and the aluminum gallium nitride layer ($Al_xGa_{1-x}N$) (where $0.1<=x<=1$) 14. The source electrode 20 and the drain electrode 22 are formed by aluminum (Al), Ti/Au, etc., for example.

The gate electrode 24 can be formed, for example by Ni/Au etc.

The source electrode contact 20a and the drain electrode contact 22a can be formed by the layered structure, which is composed of Al/Ti or Ni/Al/Ti, for example.

A two-dimensional electron gas layer is formed on the interface between the nitride based compound semiconductor layer 12 and the aluminum gallium nitride layer (AlxGa1−xN) (where $0.1<=x<=1$) 14 placed on the nitride based compound semiconductor layer 12.

The substrate 10 can be composed of a silicon carbide (SiC) substrate, a semi insulating silicon substrate, a sapphire substrate, etc.

The nitride based compound semiconductor layer 12 is formed, for example by a GaN layer.

(Result of Experiment)

Figure 6:
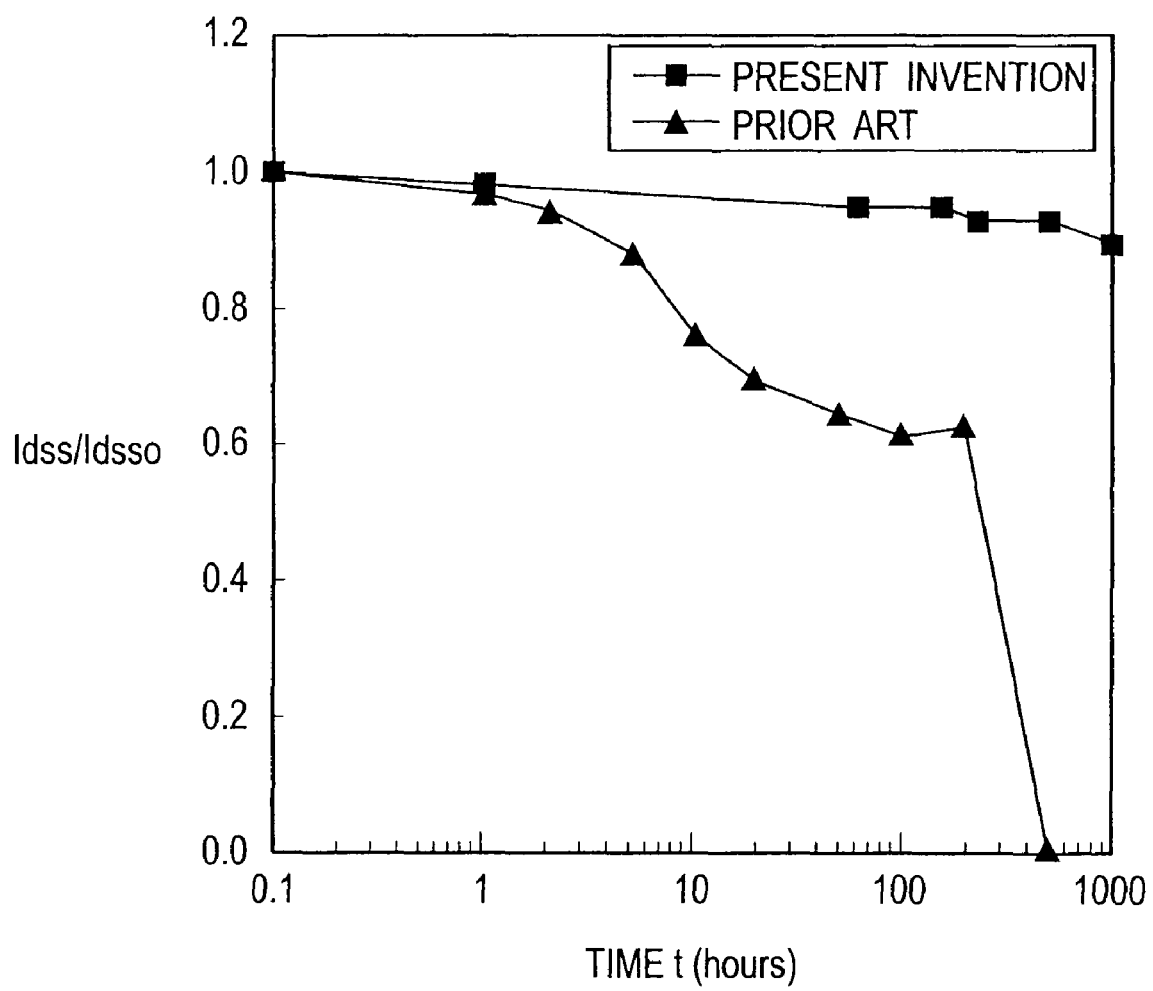
FIG. 6 shows a comparison result of the amount of variations of normalized current ratio $I_{dss}/I_{dss0}$, which applies time t for the horizontal axis, of the semiconductor device according to the first embodiment of the present invention, and the semiconductor device according to the conventional example.

The comparison result of an amount of variations of a normalized current ratio $I_{dss}/I_{dss0}$ of the semiconductor device according to the first embodiment and the semiconductor device according to the conventional example is shown in FIG. 6 by applying a horizontal axis into time t (hours). In FIG. 6, the amount of variations of the normalized current ratio $I_{dss}/I_{dss0}$ expresses the ratio of the saturation current value $I_{dss}$ between the drain and the source for saturation current value $I_{dss0}$ of an initial state. In this case, the conventional example as for a comparison corresponds to the perfect planar structure which forms the isolation region 34 by ion implantation as well as the semiconductor device according to the first embodiment, and does not form the trench regions 28a and 28b.

As clearly from FIG. 6, in the conventional example, the variation per hour of the amount of normalized current ratio $I_{dss}/I_{dss0}$ is remarkable, and the saturation current value between the drain and the source decreases with the passage of time. On the other hand, in the semiconductor device according to the first embodiment, reduction of the saturation current value is suppressed by etching the part under the gate electrode 24 and forming the trench regions 28a and 28b.

(Fabrication Method)

A fabrication method of the semiconductor device according to the first embodiment includes the step of forming the nitride based compound semiconductor layer 12 on the substrate 10; the step of forming the active area AA which is composed of the aluminum gallium nitride layer ($Al_xGa_{1-x}N$) (where $0.1<=x<=1$) 14 on the nitride based compound semiconductor layer 12; the step of forming the isolation region 34 which performs isolation of the active area AA mutually; the step of etching a part of previous arrangement part of the gate electrode 24, and forming the trench regions 28a and 28b; and the step of forming the gate electrode 24, the source electrode 20, and the drain electrode 22 on the active area AA surrounded by the isolation region 34.

In the step of forming the isolation region 34, the isolation region 34 is formed to a part of depth direction of the aluminum gallium nitride layer ($Al_xGa_{1-x}N$) (where $0.1<=x<=1$) 14 and the nitride based compound semiconductor layer 12.

In the step of forming the trench regions 28a and 28b, the trench regions 28a and 28b are formed including a part of the active area AA near the gate electrode 24, in the tip region of the gate electrode 24.

The step of being connected to the gate electrode 24 and forming the gate terminal electrode 240 on the isolation region 34 may be further included, and the trench region 28b may form including a part of the active area AA between the gate electrode 24 and the gate terminal electrode 240.

In the step of forming the isolation region 34, the isolation region 34 is formed by ion implantation.

In the following, the fabrication method of the semiconductor device according to the first embodiment of the present invention will be explained.

(a) Pouring TMG (trimethyl gallium) and ammonia gas on the SiC substrate 10, and forming GaN layer 12 in a thickness of about 1 micrometer to about 2 micrometers, for example, with epitaxial growth.

(b) Next, pouring TMAl (trimethyl aluminum) and ammonia gas, and forming the aluminum gallium nitride layer ($Al_{0.3}Ga_{0.7}N$) 14 of about 30% of an Aluminum composition ratio in a thickness of about 20 nm to about 100 nm with epitaxial growth, for example.

(c) Next, forming the isolation region 34 which performs isolation of the active area AA mutually by ion implantation technology. As ion species, nitrogen (N), argon (Ar), etc. are applicable, for example. Moreover, the amount of dosage accompanying the ion implantation is about $1 \times 10^{14}$ (ions/cm$^2$), for example, and accelerating energy is about 100 keV to about 200 keV.

(d) Next, etching a part of previous arrangement part of the gate electrode 24 by dry etching technology, and forming the trench regions 28a and 28b. As the dry etching technology, RIE (Reactive Ion Etching) technology etc. are applicable. As the reactant gas, the chlorine based etching gas, such as $BCl_3$, can be used, for example. At this point, the depth of the trench regions 28a and 28b is deeper than the thickness of the aluminum gallium nitride layer ($Al_xGa_{1-x}N$) (where $0.1<=x<=1$) 14, for example, is about 100 nm to about 200 nm. Therefore, the bottom of the trench regions 28a and 28b is the nitride based compound semiconductor layer (GaN layer) 12.

(e) Next, forming the source electrode contact 20a and the drain electrode contact 22a on the active area AA surrounded by the isolation region 34. As the electric contact formation technology, vacuum deposition technology, sputtering technology, etc. are applicable. The source electrode contact 20a and the drain electrode contact 22a are formed as an ohmic electrode by the layered structure which is composed of Al/Ti or Ni/Al/Ti, for example.

(f) Next, forming the gate electrode 24. As the electrode formation technology, vacuum deposition technology, sputtering technology, etc. are applicable. The gate electrode 24 can be formed by Ni/Au etc., for example. The gate electrode 24 forms Schottky contact between the aluminum gallium nitride layer ($Al_xGa_{1-x}N$) (where $0.1<=x<=1$) 14 and the gate electrode 24. The width of the gate electrode 24 is about 0.1 micrometer to about 1 micrometer, for example.

(g) Next, forming the insulating layer 30 for passivation on the whole device surface. This insulating layer 30 can be formed with a nitride film, an $Al_2O_3$ film, an $SiO_2$ film, an SiON film, etc. deposited by the PECVD method, for example.

(h) Next, forming the source electrode 20 and the drain electrode 22. As the electrode formation technology, vacuum deposition technology, sputtering technology, etc. are applicable. The source electrode 20 and the drain electrode 22 are formed by aluminum (Al), Ti/Au, etc., for example.

According to the above-mentioned step (a) to step (h), the semiconductor device according to the first embodiment is completed.

According to the first embodiment, in the semiconductor device composed of the GaN layer 12, the AlGaN layer 14, etc. in which isolation is performed by ion implanted processing, the semiconductor device in which it is high reliable and a miniaturization is realizable, and the fabrication method for the same can be provided by etching the part under the gate electrode 24 and forming the trench regions 28a and 28b.

According to the first embodiment, by etching the part under the gate electrode 24 and forming the trench regions 28a and 28b, an electron can be prevented from being injected into GaN layer 12, accordingly, the current collapse phenomenon in which the drain current of the device decreases gradually can be suppressed, and the semiconductor device in which it is high reliable and a miniaturization is realizable, and a fabrication method for the same can be provided.

According to the first embodiment, by unevenness on the surface of the device almost being exhausted, focusing of an exposure device becomes easy and, accordingly, the semiconductor device in which the miniaturization of the gate electrode is realizable and whose high frequency characteristics also improve, and a fabrication method for the same can be provided.

Second Embodiment (Element Structure)

Figure 7:
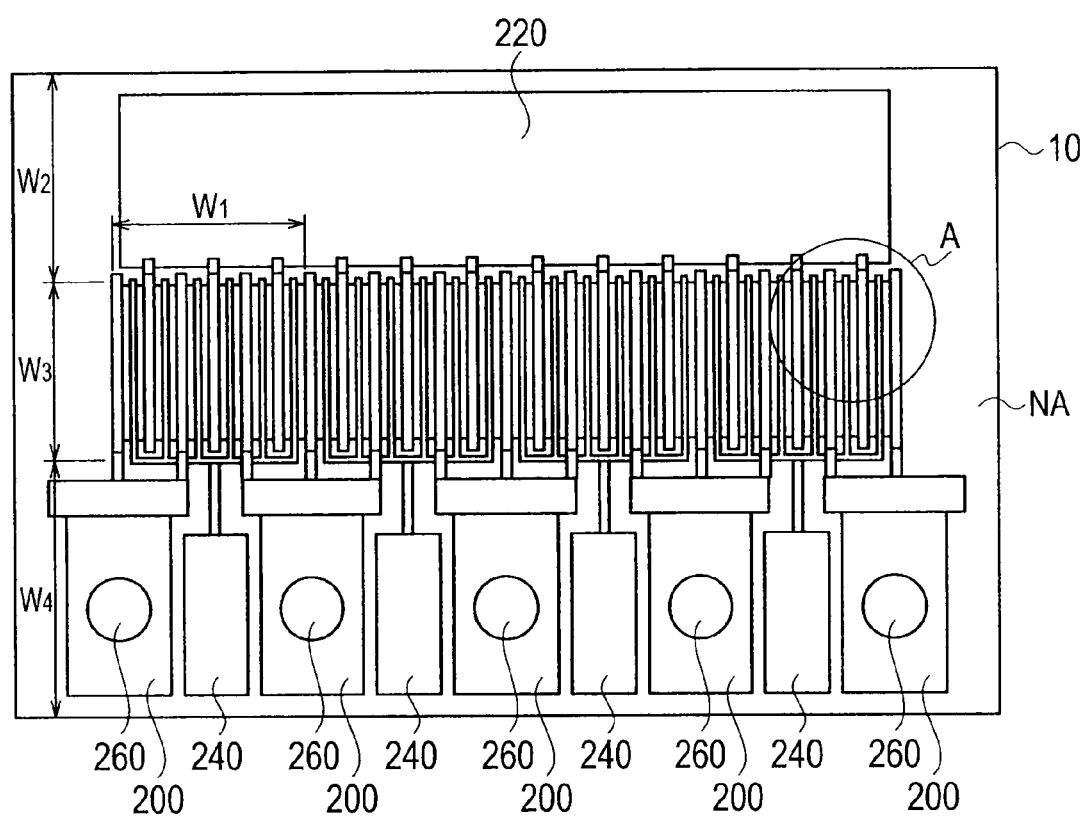
FIG. 7 is an overall schematic plane pattern configuration diagram of a semiconductor device according to a second embodiment of the present invention.
Figure 8:
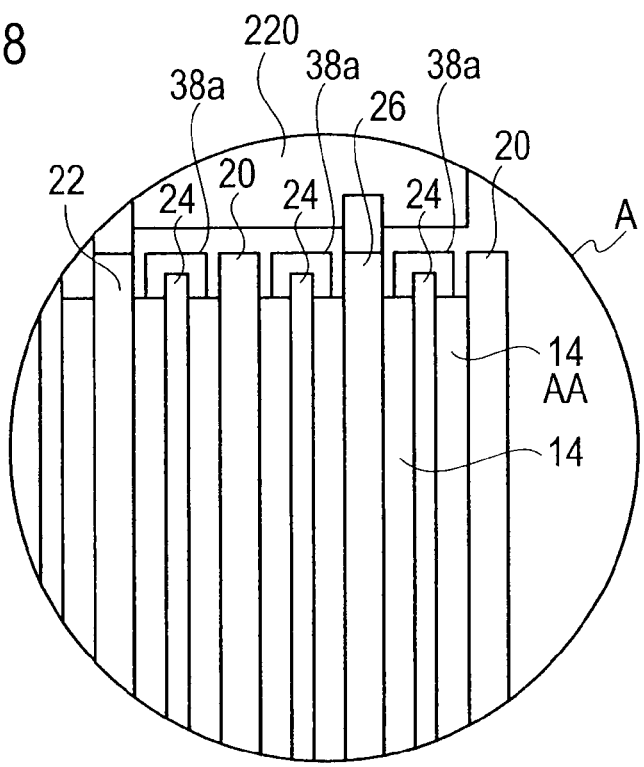
FIG. 8 is an enlarged drawing of part A of FIG. 7.

An overall schematic plane pattern configuration of a semiconductor device according to a second embodiment is expressed as shown in FIG. 7. Moreover, the enlarged drawing of the part A of FIG. 7 is expressed as shown in FIG. 8. Since the fundamental element section structure is the same as that of FIG. 4 to FIG. 5 shown in the first embodiment, the description of each layer is omitted.

In the semiconductor device according to the second embodiment, an electrode pattern assignment for high power and the trench region 38a formed under the gate electrode 24 are provided.

As shown in FIG. 4 to FIG. 5 and FIG. 7 to FIG. 8, the overall configuration of the semiconductor device according to the second embodiment includes a substrate 10; a nitride based compound semiconductor layer 12 placed on the substrate 10; an active area AA which is placed on the nitride based compound semiconductor layer 12, and is composed of the aluminum gallium nitride layer ($Al_xGa_{1-x}N$) (where $0.1<=x<=1$) 14; an isolation region 34 which performs isolation of the active area AA mutually; a trench region 38a formed by etching for a part of previous arrangement to the gate electrode 24 having a plurality of fingers; a gate electrode 24, a source electrode 20, and a drain electrode 22 which are placed on a first surface of the active area AA surrounded by the isolation region 34, and have a plurality of fingers, respectively; a gate terminal electrode 240, a source terminal electrode 200, and a drain terminal electrode 220 which are placed on a first surface of the substrate 10, govern a plurality of fingers, respectively and is formed for every the gate electrode 24, the source electrode 20, and the drain electrode 22.

The isolation region 34 is formed to a part of depth direction of the aluminum gallium nitride layer ($Al_xGa_{1-x}N$) (where $0.1<=x<=1$) 14 and the nitride based compound semiconductor layer 12.

In the tip region of the gate electrode 24 having a plurality of fingers, the trench region 38a is formed including a part of the active area AA near the gate electrode 24.

The trench region may be formed including a part of the active area AA between the gate electrode 24 and the gate terminal electrode 240 as well as the configuration of the trench region 38b shown in FIG. 3.

Moreover, the isolation region 34 is formed by ion implantation.

In the configuration example of FIG. 7, as for the size of each part, for example, the cell width $W_1$ is about 120 micrometers, $W_2$ is about 80 micrometers, the cell length $W_3$ is about 100 micrometers, $W_4$ is about 120 micrometers, and the gate width $W_G$ is about 100 micrometer×6×4 cell=2.4 mm as a whole.

In the example of FIG. 7, in the source terminal electrode 200, a VIA hole 260 is formed from the backside of the substrate 10, and the ground conductor is formed on the backside of the substrate 10. And when grounding a circuit element, the circuit element provided on the substrate 10 and the ground conductor formed on the backside of the substrate 10 are electrically connected via the VIA hole 260 which passes through the substrate 10.

In addition, the gate terminal electrode 240 is connected to a surrounding semiconductor chip by a bonding wire etc., and the drain terminal electrode 220 is also connected to a surrounding semiconductor chip by a bonding wire etc.

(Fabrication Method)

A fabrication method of the semiconductor device according to the second embodiment includes the step of forming the nitride based compound semiconductor layer 12 on the substrate 10; the step of forming the active area AA which is composed of the aluminum gallium nitride layer ($Al_xGa_{1-x}N$) (where $0.1<=x<=1$) 14 on the nitride based compound semiconductor layer 12; the step of forming the isolation region 34 which performs isolation of the active area AA mutually; the step of etching a part of previous arrangement part of the gate electrode 24 having a plurality of fingers, and forming the trench region 38a; the step of forming the gate electrode 24, the source electrode 20, and the drain electrode 22 which have a plurality of fingers, respectively, on the first surface of the active area AA surrounded by the isolation region 34; and the step of forming the gate terminal electrode 240, the source terminal electrode 200, and the drain terminal electrode 220 which govern a plurality of fingers, respectively and are formed on the first surface of the substrate 10 every the gate electrode 24, the source electrode 20, and the drain electrode 22.

In the step of forming the isolation region 34, the isolation region 34 is formed to a part of depth direction of the aluminum gallium nitride layer ($Al_xGa_{1-x}N$) (where $0.1<=x<=1$) 14 and the nitride based compound semiconductor layer 12.

In the step of forming the trench region 38, the trench region 38 are formed including a part of the active area AA near the gate electrode 24 having a plurality of fingers, in the tip region of the gate electrode 24.

In the step of forming the isolation region 34, the isolation region 34 is formed by ion implantation.

Since it is the same as that of the first embodiment about the details of the fabrication method of the semiconductor device according to the second embodiment, the description is omitted.

Modified Example

Figure 9:
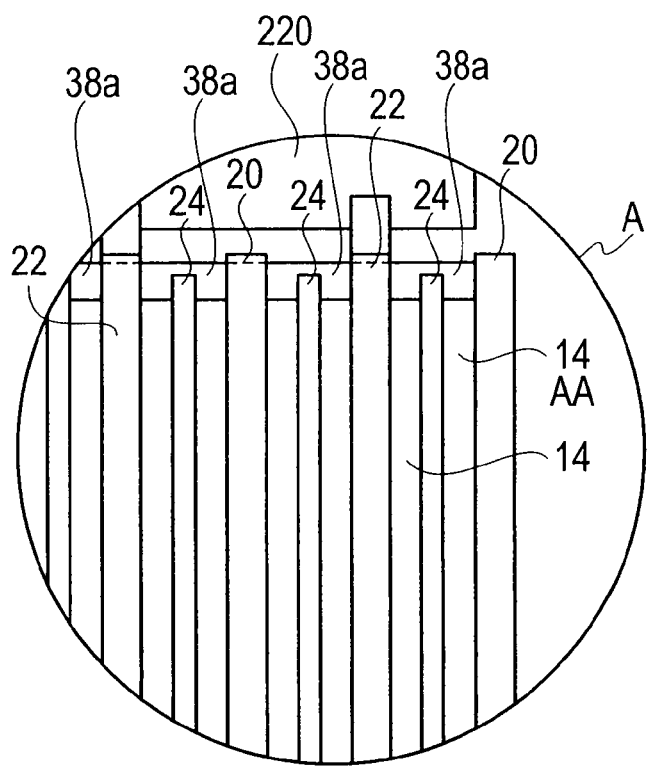
FIG. 9 is a schematic plane pattern configuration diagram of a semiconductor device according to the modified example of the second embodiment of the present invention.

A schematic plane pattern configuration of a semiconductor device according to a modified example of the second embodiment is expressed as shown in FIG. 9.

In the semiconductor device according to the modified example of the 2nd embodiment, as shown in FIG. 9, in the tip region of the gate electrode 24 having a plurality of fingers, the trench region 38a is formed in stripe shape in parallel to the arrangement direction of a plurality of finger electrodes including a part of the active area AA near the gate electrode 24.

In the step of forming the trench region 38a also in a fabrication method of the semiconductor device according to the modified example of the second embodiment, in the tip region of the gate electrode 24 having a plurality of fingers, the trench region 38a is formed in stripe shape in parallel to the arrangement direction of a plurality of finger electrodes including a part of the active area AA near the gate electrode 24.

Furthermore, as shown in FIG. 3 and FIG. 5, the trench region 38b may be formed under the gate electrode 24 having a plurality of fingers including a part of the active area AA between the gate terminal electrode 240 placed on the isolation region 34 and the gate electrode 24 having a plurality of fingers.

Moreover, these trench regions 38b may be formed in stripe shape in parallel to the arrangement direction of a plurality of finger electrodes as well as FIG. 9.

According to the second embodiment of the present invention, in the semiconductor device for high power which is composed of the GaN layer 12, the AlGaN layer 14, etc. in which isolation is performed by ion implantation processing, the semiconductor device for high power in which it is highly reliable and a miniaturization is realizable, and the fabrication method for the same can be provided by etching the part under the gate electrode 24 and forming the trench region 38a.

According to the second embodiment of the present invention, by etching the part under the gate electrode 24 and forming the trench region 38a, an electron can be prevented from being injected into GaN layer 12, accordingly, the current collapse phenomenon in which the drain current of the device decreases gradually can be suppressed, and the semiconductor device for high power in which it is highly reliable and a miniaturization is realizable, and a fabrication method for the same can be provided.

According to the second embodiment of the present invention, by unevenness on the surface of the device almost being exhausted, focusing of an exposure device becomes easy and, accordingly, the semiconductor device for high power in which the miniaturization of the gate electrode 24 is realizable and whose high frequency characteristics also improve, and a fabrication method for the same can be provided.

Third Embodiment (Element Structure)

Figure 10:
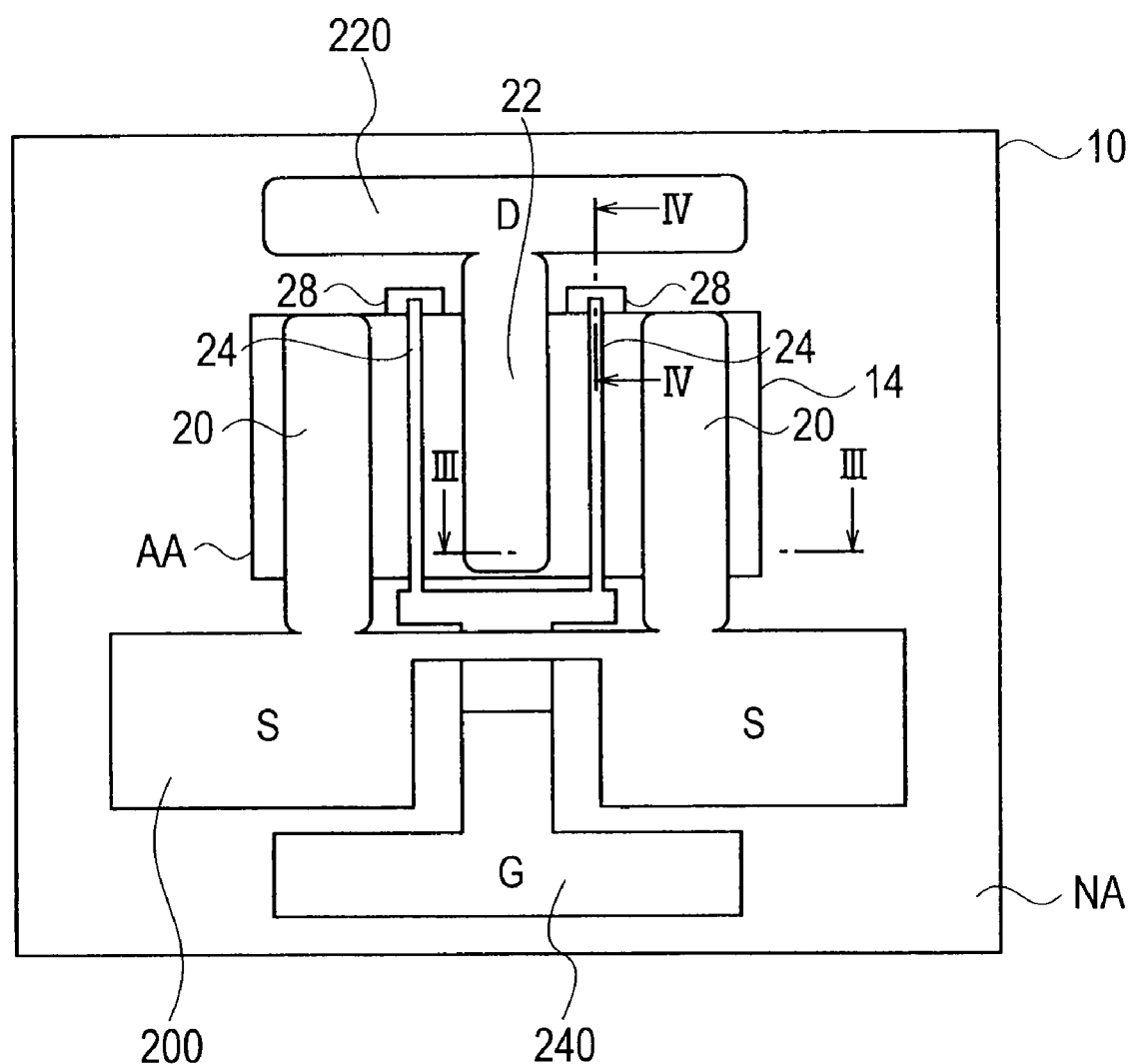
FIG. 10 is a schematic plane pattern configuration diagram of a semiconductor device according to a third embodiment of the present invention.
Figure 11:
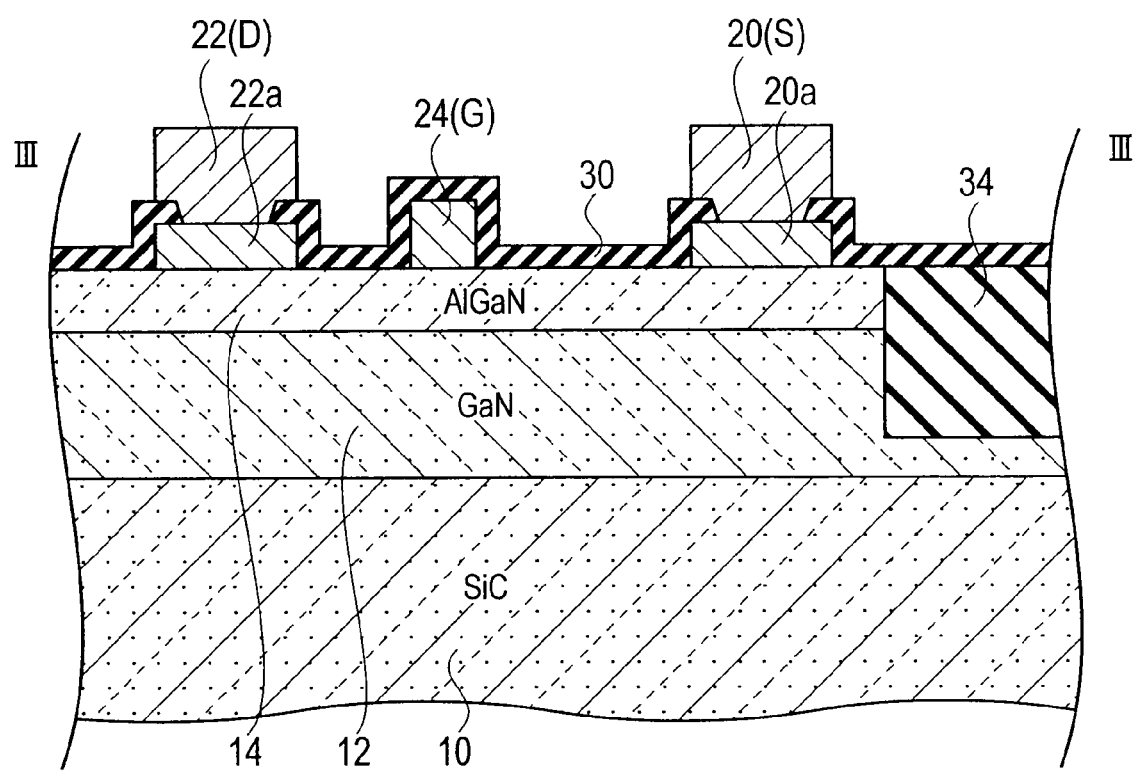
FIG. 11 is a schematic cross-sectional configuration chart, which forms an isolation region by ion implantation and is taken in the line III-III of FIG. 10.
Figure 12:
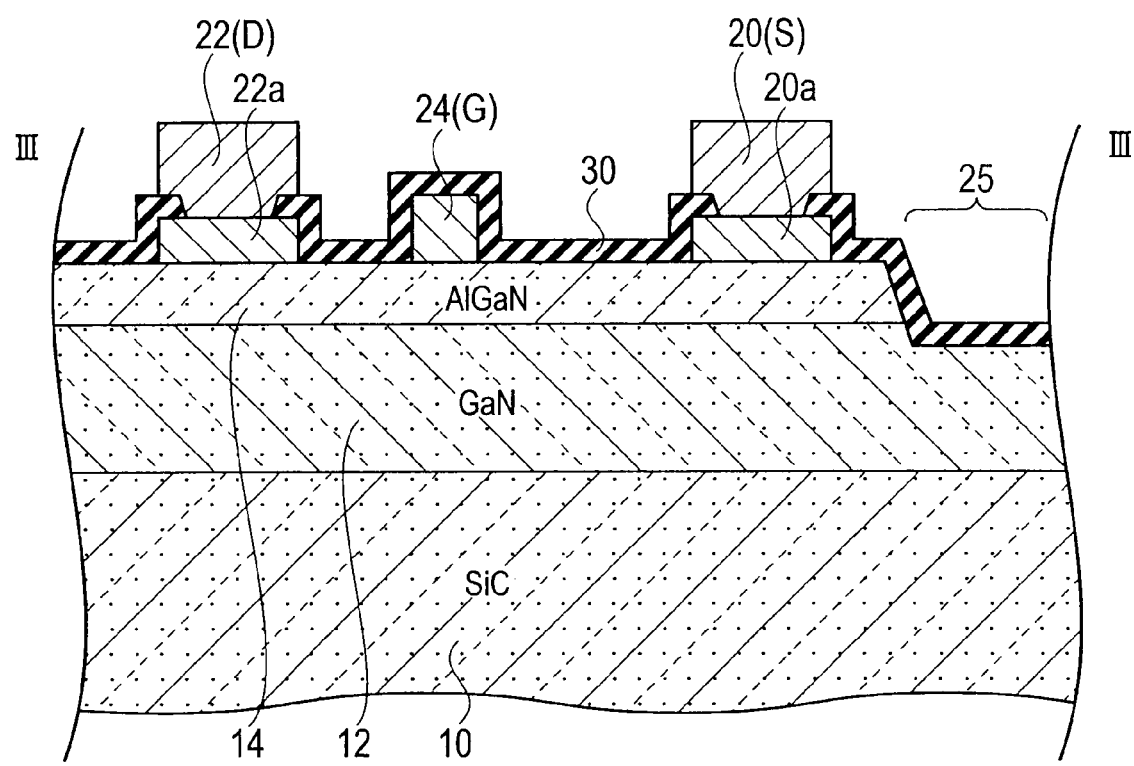
FIG. 12 is a schematic cross-sectional configuration chart, which forms an isolation region by mesa etching and is taken in the line III-III of FIG. 10.

The schematic plane pattern configuration of a semiconductor device according to a third embodiment of the present invention is expressed as shown in FIG. 10. Moreover, the schematic section structure taken in the line III-III of FIG. 10 is expressed as shown in FIG. 11 or FIG. 12. The example of FIG. 11 is a section structure which forms an isolation region 34 acting as a non-active area NA by using ion implantation technology, and the example of FIG. 12 is a section structure which forms an isolation region 25 acting as a non-active area NA by using mesa etching technology.

As shown in FIG. 10 to FIG. 12, the semiconductor device according to the third embodiment includes a substrate 10; a nitride based compound semiconductor layer 12 placed on the substrate 10; an active area AA which is placed on the nitride based compound semiconductor layer 12, and is composed of the aluminum gallium nitride layer ($Al_xGa_{1-x}N$) (where $0.1<=x<=1$) 14; an isolation regions (34, 25) which perform isolation of the active area AA mutually; a gate electrode 24, a source electrode 20, and a drain electrode 22 which are placed on the active area AA surrounded by the isolation regions (34, 25); a gate terminal electrode 240, a source terminal electrode 200, and a drain terminal electrode 220 which are placed on the isolation regions (34, 25) and are connected to the gate electrode 24, the source electrode 20, and the drain electrode 22, respectively; and a trench region 28 formed between the gate electrode 24 and the drain terminal electrode 220.

The isolation regions (34, 25) are formed to a part of depth direction of the aluminum gallium nitride layer ($Al_xGa_{1-x}N$) (where $0.1<=x<=1$) 14 and the nitride based compound semiconductor layer 12.

The isolation region 34 is formed of ion implantation. As ion species, nitrogen (N), argon (Ar), etc. are applicable, for example. Moreover, the amount of dosage accompanying the ion implantation is about $1\times10^{14}$ (ions/cm$^2$), for example, and accelerating energy is about 100 keV to about 200 keV.

An insulating layer 30 for passivation is formed on the isolation region 34 and the device surface. As this insulating layer 30, it can form with a nitride film, an alumina ($Al_2O_3$) film, an oxide film ($SiO_2$), an oxy-nitride film (SiON), etc. deposited by the PECVD (Plasma Enhanced Chemical Vapor Deposition) method, for example.

The insulating layer 30 for passivation may be placed also in the trench region 28.

A source electrode contact 20a is formed on the interface between the source electrode 20 and the aluminum gallium nitride layer ($Al_xGa_{1-x}N$) (where $0.1<=x<=1$) 14, and a drain electrode contact 22a is formed on the interface between the drain electrode 22 and the aluminum gallium nitride layer ($Al_xGa_{1-x}N$) (where $0.1<=x<=1$) 14. The source electrode 20 and the drain electrode 22 are formed by aluminum (Al), Ti/Au, etc., for example.

The gate electrode 24 can be formed of Ni/Au etc, for example.

The source electrode contact 20a and the drain electrode contact 22a can be formed by the layered structure, which is composed of Al/Ti or Ni/Al/Ti, for example.

A two-dimensional electron gas layer is formed on the interface between the nitride based compound semiconductor layer 12 and the aluminum gallium nitride layer ($Al_xGa_{1-x}N$) (where $0.1<=x<=1$) 14 placed on the nitride based compound semiconductor layer 12.

Moreover, the substrate 10 may be provided with either of an SiC substrate, a GaN substrate, a substrates in which the GaN epitaxial layer is formed on the SiC substrate, a substrate in which the GaN epitaxial layer is formed on the Si substrate, a substrate in which the hetero-junction epitaxial layer composed of GaN/AlGaN is formed on the SiC substrate, a substrate in which the GaN epitaxial layer is formed on the sapphire substrate, and a sapphire substrate or a diamond substrate.

The nitride based compound semiconductor layer 12 is formed, for example by a GaN layer.

(Structural Example of Trench Region)

Structural Example 1

Figure 13:
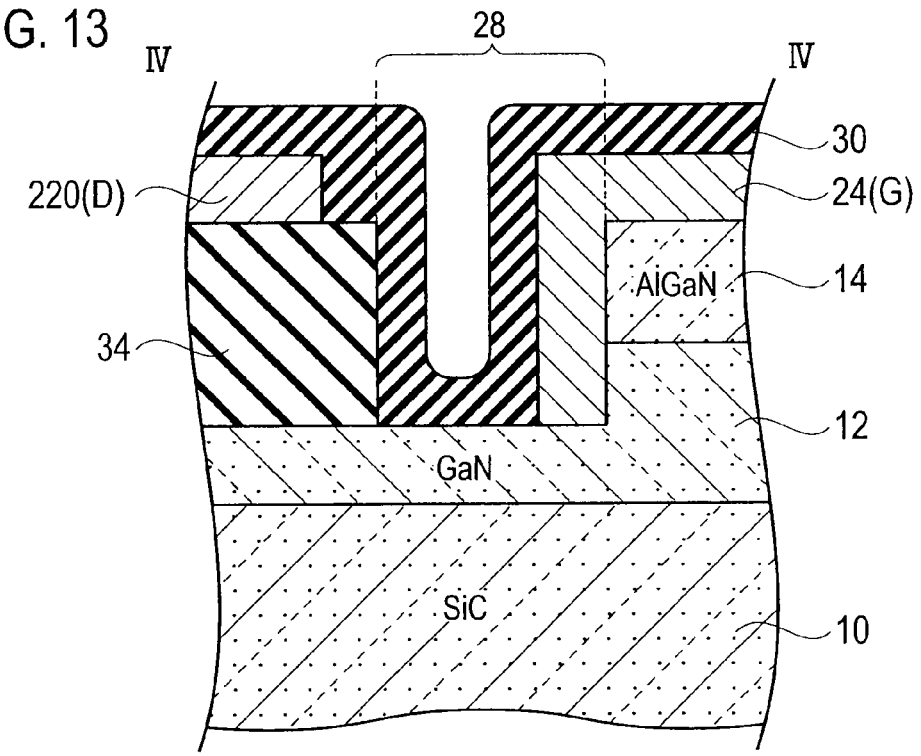
FIG. 13 shows an example 1 of schematic section structure taken in the line IV-IV of FIG. 10.

In the tip region of the gate electrode 24, the trench region 28 is formed including a part of the active area AA, for example, as shown in FIG. 13. Moreover, the trench region 28 is formed including a part of the isolation region 34 between the gate electrode 24 and the drain terminal electrode 220, as shown in FIG. 13. Moreover, as shown in FIG. 13, in the trench region 28, the tip region of the gate electrode 24 extends and is placed.

Structural Example 2

Figure 14:
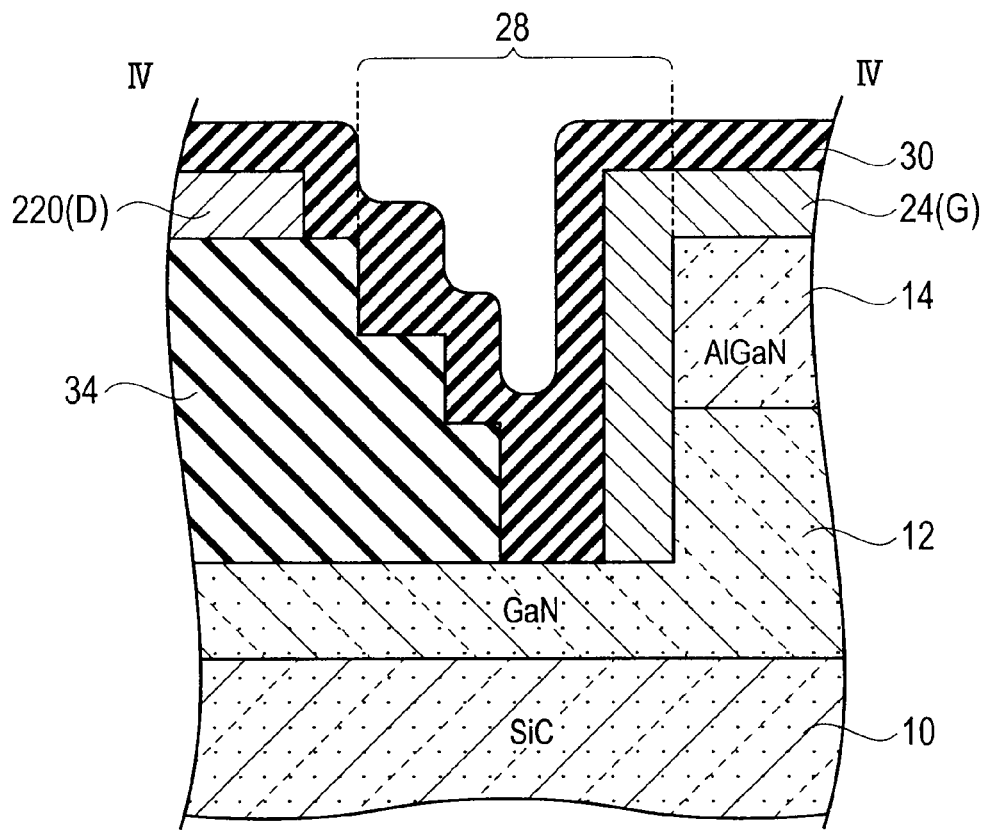
FIG. 14 shows an example 2 of schematic section structure taken in the line IV-IV of FIG. 10.

In the sidewall part of the isolation region 34, the sidewall of the trench region 28 is provided with stepping structure, for example, as shown in FIG. 14. Two or more steps of numbers of steps may be formed not only in two steps. Moreover, the stepping structure may be provided in the sidewall part by the side of the semiconductor.

Structural Example 3

Figure 15:
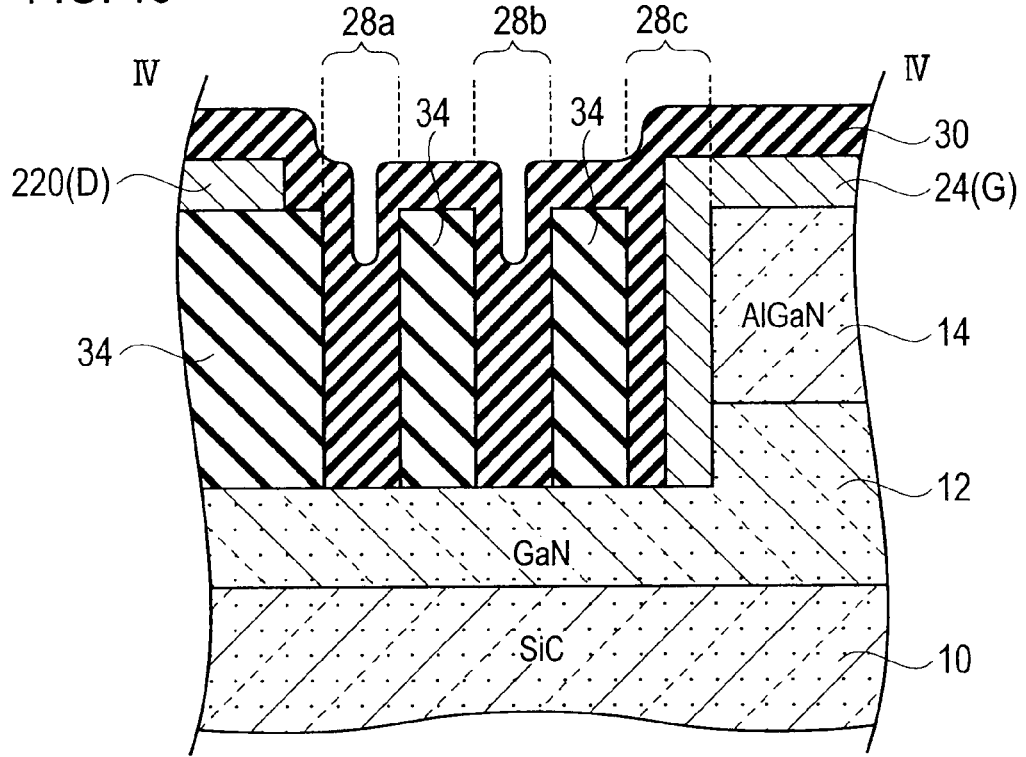
FIG. 15 shows an example 3 of schematic section structure taken in the line IV-IV of FIG. 10.

Moreover, a plurality of trench regions may be formed, for example, as shown in FIG. 15. In the example of FIG. 15, three trench regions 28a, 28b, and 28c are formed. The trench regions 28a, 28b, and 28c are formed including a part of the isolation region 34 between the gate electrode 24 and the drain terminal electrode 220, as shown in FIG. 15. It fills up with the insulating layer 30 in the trench region 28a and 28b. On the other hand, in the tip region of the gate electrode 24, it is formed in the trench region 28c including a part of active area AA. Moreover, the tip region of the gate electrode 24 extends and is placed in the trench region 28c.

Structural Example 4

Figure 16:
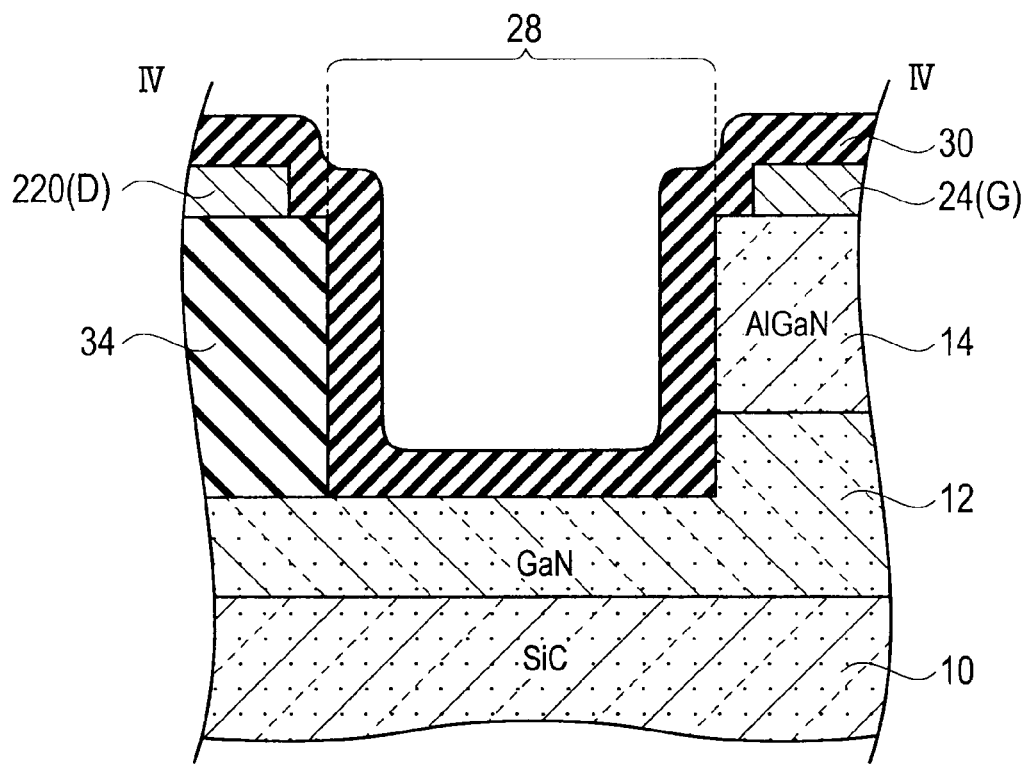
FIG. 16 shows an example 4 of schematic section structure taken in the line IV-IV of FIG. 10.

Moreover, as shown in FIG. 16, the tip region and the drain terminal electrode 220 of the gate electrode 24 may be provided with the isolated structure by the trench region 28. The insulating layer 30 is formed in the trench region 28.

Moreover, two trench regions 28 of each other shown in FIG. 10 are combined, and the arrangement direction of the source electrode 20, the gate electrode 24, and the drain electrode 22 may be provided with stripe geometry.

Furthermore, another trench region where structure is substantially equal to the trench region 28 may be formed between the gate electrode 24 and the gate terminal electrode 240. As well as the tip region of the stripe of the gate electrode 24, although it is easy to concentrate an electric field also in a terminal part, it is because generating of the leakage current between the gate and the drain can be suppressed by forming another trench region.

(Fabrication Method)

A fabrication method of the semiconductor device according to the third embodiment includes the step of forming the nitride based compound semiconductor layer 12 on the substrate 10; the step of forming the active area AA which is composed of the aluminum gallium nitride layer ($Al_xGa_{1-x}N$) (where $0.1<=x<=1$) 14 on the nitride based compound semiconductor layer 12; the step of forming the isolation regions (34, 25) which perform isolation of the active area AA mutually; the step of forming the gate electrode 24, the source electrode 20, and the drain electrode 22 on the active area AA surrounded by the isolation regions (34, 25); the step of forming the gate terminal electrode 240, the source terminal electrode 200, and the drain terminal electrode 220 which are connected to the gate electrode 24, the source electrode 20, and the drain electrode 22, respectively on the isolation regions (34, 25); and the step of forming the trench region 28 between the gate electrode 24 and the drain terminal electrode 220.

The step of forming the trench region 28 is preferable to perform after the step of forming the isolation regions (34, 25).

Moreover, ion implantation technology can be used for the step of forming the isolation region 34.

Moreover, mesa etching can be used for the step of forming the isolation region 25.

In the step of forming the isolation region 34, the isolation region 34 is formed to a part of depth direction of the aluminum gallium nitride layer ($Al_xGa_{1-x}N$) (where $0.1<=x<=1$) 14 and the nitride based compound semiconductor layer 12.

In the following, the fabrication method of the semiconductor device according to the third embodiment of the present invention will be explained in detail.

(a) Pouring TMG (trimethyl gallium) and ammonia gas on the substrate 10 which is composed of SiC, and forming GaN layer 12 in a thickness of about 1 micrometer to about 2 micrometers, for example, with epitaxial growth.

(b) Next, pouring TMAl (trimethyl aluminum) and ammonia gas, and forming the aluminum gallium nitride layer ($Al_{0.3}a_{0.7}N$) 14 of about 30% of an Aluminum composition ratio in a thickness of about 20 nm to about 100 nm, for example, with epitaxial growth.

(c) Next, forming the isolation region 34, which performs isolation of the active area AA mutually by ion implantation technology. As ion species, nitrogen (N), argon (Ar), etc. are applicable, for example. Moreover, the amount of dosage accompanying ion implantation is about $1\times10^{14}$ (ions/cm$^2$), for example, and the accelerating energy is about 100 keV to about 200 keV. In addition, the isolation region 25, which performs isolation of the active area AA mutually may be formed by mesa etching technology. The following description will be explained using the example of the isolation region 34 formed of ion implantation technology.

(d) Next, forming the trench region 28 between the gate electrode 24 and the drain terminal electrode 220 by dry etching technology. As the dry etching technology, RIE (Reactive Ion Etching) technology etc. are applicable. As the reactant gas, the chlorine based etching gas, such as $BCl_3$, can be used, for example. At this point, the depth of the trench region 28 is deeper than the thickness of the aluminum gallium nitride layer ($Al_xGa_{1-x}N$) (where $0.1<=x<=1$) 14, for example, is about 100 nm to about 200 nm. Therefore, the bottom of the trench region 28 is the nitride based compound semiconductor layer (GaN layer) 12.

In addition, the structure of the trench region 28 can apply the structure shown in FIG. 13 to FIG. 16, for example.

(e) Next, forming the source electrode contact 20a and the drain electrode contact 22a on the active area AA surrounded by the isolation region 34. As the electric contact formation technology, vacuum deposition technology, sputtering technology, etc. are applicable. The source electrode contact 20a and the drain electrode contact 22a are formed as an ohmic electrode by the layered structure, which is composed of Al/Ti or Ni/Al/Ti, for example.

(f) Next, forming the gate electrode 24. As the electrode formation technology, vacuum deposition technology, sputtering technology, etc. are applicable. The gate electrode 24 can be formed of Ni/Au etc., for example. The gate electrode 24 forms Schottky contact with the aluminum gallium nitride layer ($Al_xGa_{1-x}N$) (where $0.1<=x<=1$) 14. The width of the gate electrode 24 is about 0.1 micrometer to about 1 micrometer, for example. In addition, the tip region of the gate electrode 24 may be extended and formed in the trench region 28, as shown in FIG. 13 to FIG. 15. Or it may be isolated and formed in the outside of the trench region 28 as shown in FIG. 16.

(g) Next, forming the gate terminal electrode 240, the source terminal electrode 200, and the drain terminal electrode 220 which are connected to the gate electrode 24, the source electrode contact 20a, and the drain electrode contact 22a, respectively on the isolation region 34.

(h) Next, forming the insulating layer 30 for passivation on the whole device surface. This insulating layer 30 can be formed with a nitride film, an $Al_2O_3$ film, an $SiO_2$ film, an SiON film, etc. deposited by the PECVD method, for example.

(i) Next, forming the source electrode 20 and the drain electrode 22. As the electrode formation technology, vacuum deposition technology, sputtering technology, etc. are applicable. The source electrode 20 and the drain electrode 22 are formed of aluminum (Al), Ti/Au, etc., for example.

According to the above-mentioned step (a) to step (i), the semiconductor device according to the third embodiment is completed.

According to the third embodiment, by etching the part between the gate electrode 24 and the drain terminal electrode 220 and forming the trench region 28, the leakage current between gate drains can be decreased, and a highly reliable and high performance semiconductor device for high power and a fabrication method for the same can be provided.

According to the third embodiment, by etching the part between the gate electrode 24 and the drain terminal electrode 220 and forming the trench region 28, the surface leakage current between the gate and the drain can be decreased by lengthening distance between the gate electrode 24 and the drain terminal electrode 220 effectually, and a highly reliable and high performance semiconductor device for high power and a fabrication method for the same can be provided.

Fourth Embodiment (Whole Element Structure)

The schematic plane pattern configuration of a semiconductor device according to a fourth embodiment is expressed as well as shown in FIG. 7. Moreover, in the semiconductor device according to the fourth embodiment, the enlarged drawing of the part A of FIG. 7 is expressed as shown in FIG. 17.

Figure 17:
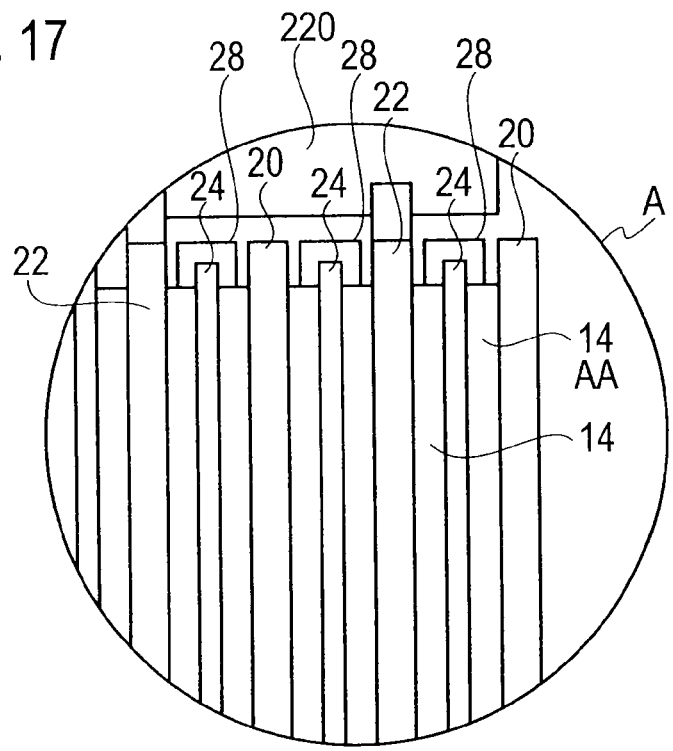
FIG. 17 is a schematic plane pattern configuration diagram of a semiconductor device according to a fourth embodiment of the present invention.

In the semiconductor device according to the fourth embodiment shown in FIG. 7 and FIG. 17, it has the electrode pattern assignment for large amount of power, and the trench region 28 formed between the gate electrode 24 and the drain terminal electrode 220.

As shown in FIG. 7 and FIG. 17, the schematic plane pattern configuration of the semiconductor device according to the fourth embodiment includes a substrate 10; a nitride based compound semiconductor layer 12 placed on the substrate 10; an active area AA which is placed on the nitride based compound semiconductor layer 12, and is composed of the aluminum gallium nitride layer ($Al_xGa_{1-x}N$) (where $0.1<=x<=1$) 14; an isolation region 34 which performs isolation of the active area AA mutually; a gate electrode 24, a source electrode 20, and a drain electrode 22 which are placed on the active area AA surrounded by the isolation region 34, and have a plurality of fingers, respectively; a gate terminal electrode 240, a source terminal electrode 200, and a drain terminal electrode 220 which governs a plurality of fingers, respectively and is formed for every gate electrode 24, source electrode 20, and drain electrode 22; and a trench region 28 formed between the gate electrode 24 and the drain terminal electrode 220.

The isolation region 34 is formed to a part of depth direction of the aluminum gallium nitride layer ($Al_xGa_{1-x}N$) (where $0.1<=x<=1$) 14 and the nitride based compound semiconductor layer 12.

The isolation region 34 is formed of ion implantation technology, for example.

In the tip region of the gate electrode 24, which has a plurality of fingers, the trench region 28 may be formed including a part of the active area AA.

The trench region 28 may be formed including a part of isolation region 34 between the gate electrode 24 and the drain terminal electrode 220 which have a plurality of fingers.

In the trench region 28, as well as the structure shown in FIG. 13 to FIG. 15, the tip region of the gate electrode 24, which has a plurality of fingers may be extended and placed.

The sidewall of the trench region 28 may be provided with stepping structure as well as the structure shown in FIG. 14.

A plurality of trench regions 28 may be formed as well as the structure shown in FIG. 15.

As shown in FIG. 16, the tip region of the gate electrode 24, which have a plurality of fingers, and the drain terminal electrode 220 may be isolated by the trench region 28, and the insulating layer 30 for passivation may be formed in the trench region 28.

Furthermore, another trench region where structure is substantially equal to the trench region 28 may be formed between the gate electrode 24, which have a plurality of fingers, and the gate terminal electrode 240. As well as the tip region of the stripe of the gate electrode 24, although it is easy to concentrate an electric field also in a terminal part, it is because generating of the leakage current between the gate and the drain can be suppressed by forming another trench region.

The substrate 10 may be provided with either of an SiC substrate, a GaAs substrate, a GaN substrate, a substrates in which the GaN epitaxial layer is formed on the SiC substrate, a substrate in which the GaN epitaxial layer is formed on the Si substrate, a substrate in which the hetero-junction epitaxial layer composed of GaN/AlGaN is formed on the SiC substrate, a substrate in which the GaN epitaxial layer is formed on the sapphire substrate, and a sapphire substrate or a diamond substrate.

In the semiconductor device according to the fourth embodiment, as for the size of each part, for example, the cell width $W_1$ is about 120 micrometers, $W_2$ is about 80 micrometers, the cell length $W_3$ is about 100 micrometers, $W_4$ is about 120 micrometers, and the gate width $W_G$ is about 100 micrometers×6×4 cells=2.4 mm as a whole, as well as FIG. 7.

As well as FIG. 7, in the source terminal electrode 200, a VIA hole 260 is formed from the backside of the substrate 10, and the ground conductor is formed on the backside of the substrate 10. And when grounding a circuit element, the circuit element provided on the substrate 10 and the ground conductor formed on the backside of the substrate 10 are electrically connected via the VIA hole 260 which passes through the substrate 10.

In addition, the gate terminal electrode 240 is connected to a surrounding semiconductor chip by a bonding wire etc., and the drain terminal electrode 220 is also connected to a surrounding semiconductor chip by a bonding wire etc.

(Fabrication Method)

A fabrication method of the semiconductor device according to the fourth embodiment includes the step of forming the nitride based compound semiconductor layer 12 on the substrate 10; the step of forming the active area AA which is composed of the aluminum gallium nitride layer ($Al_xGa_{1-x}N$) (where $0.1<=x<=1$) 14 on the nitride based compound semiconductor layer 12; the step of forming the isolation regions (34, 25) which perform isolation of the active area AA mutually; the step of forming the gate electrode 24, the source electrode 20, and the drain electrode 22 which have a plurality of fingers, respectively on a first surface of the active area AA surrounded by the isolation regions (34, 25); the step of forming the gate terminal electrode 240, the source terminal electrode 200, and the drain terminal electrode 220 which governs a plurality of fingers, respectively and is formed for every gate electrode 24, source electrode 20, and drain electrode 22 on the isolation regions (34, 25); and the step of forming the trench region 28 between the gate electrode 24 and the drain terminal electrode 220 which have a plurality of fingers.

The step of forming the trench region 28 is preferable to perform after the step of forming the isolation regions (34, 25).

Moreover, the ion implantation technology can be used for the step of forming the isolation region 34.

Moreover, the mesa etching technology can be used for the step of forming the isolation region 25.

Since it is the same as that of the third embodiment about the details of the fabrication method of the semiconductor device according to the fourth embodiment, the description is omitted.

Since the detailed structure of the trench region 28 is the same as that of the third embodiment also in the semiconductor device according to the fourth embodiment, the description is omitted.

Modified Example

Figure 18:
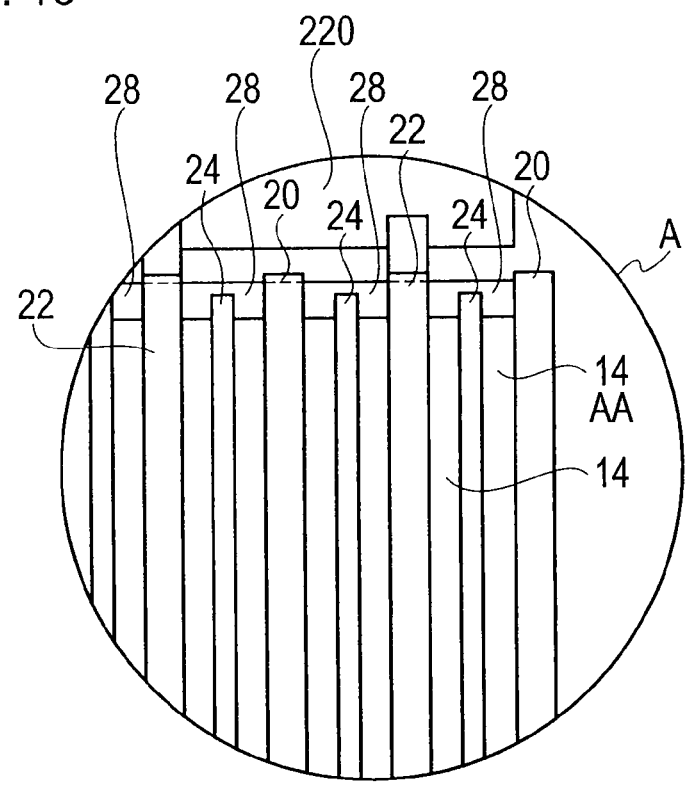
FIG. 18 is a schematic plane pattern configuration diagram of a semiconductor device according to a modified example of the fourth embodiment of the present invention.

A schematic plane pattern configuration of a semiconductor device according to a modified example of the fourth embodiment is expressed as shown in FIG. 18.

In the semiconductor device according to the modified example of the fourth embodiment, as shown in FIG. 18, the trench region 28 has the characteristic at the point provided with stripe geometry in parallel to the arrangement direction of a plurality of finger electrodes between the gate electrode 24 which have a plurality of fingers and the drain terminal electrode 220.

Since the detailed structure of the trench region 28 is the same as that of the third embodiment also in the semiconductor device according to the modified example of the fourth embodiment, the description is omitted.

Moreover, since the fabrication method of the semiconductor device according to the modified example of the fourth embodiment is the same as that of the third embodiment, the description is omitted.

Furthermore, another trench region where structure is substantially equal to the trench region 28 may be formed between the gate electrode 24 which have a plurality of fingers and the gate terminal electrode 240. As well as the tip region of the stripe of the gate electrode 24, although it is easy to concentrate an electric field also in a terminal part, it is because generating of the leakage current between the gate and the drain can be suppressed by forming another trench region.

According to the fourth embodiment and its modified example, by etching the part between the gate electrode 24 and the drain terminal electrode 220 and forming the trench region 28, the leakage current between the gate and the drain can be decreased, and a highly reliable and high performance semiconductor device for high power and a fabrication method for the same can be provided.

According to the fourth embodiment and its modified example, by etching the part between the gate electrode 24 and the drain terminal electrode 220 and forming the trench region 28, the surface leakage current between the gate and the drain can be decreased by lengthening distance between the gate electrode 24 and the drain terminal electrode 220 effectively, and a highly reliable and high performance semiconductor device for high power and a fabrication method for the same can be provided.

Other Embodiments

While the present invention is described in accordance with the aforementioned first through fourth embodiments and those modified examples, it should not be understood that the description and drawings that configure part of this disclosure are to limit the present invention. This disclosure makes clear a variety of alternative embodiments, working examples, and operational techniques for those skilled in the art.

In addition, it cannot be overemphasized that the semiconductor devices according to the embodiment of the present invention are applicable not only to FETs but also other amplifying elements, such as HEMTs (High Electron Mobility Transistors), LDMOS (Lateral Doped Metal-Oxide-Semiconductor) FETS, HBTs (Hetero-junction Bipolar Transistors), and MEMS (Micro Electro Mechanical Systems) devices.

Such being the case, the present invention covers a variety of embodiments, whether described or not.

INDUSTRIAL APPLICABILITY

A semiconductor device according to the present invention has a wide range of application fields, such as an internally matched power amplifier, a power MMIC (Monolithic Microwave Integrated Circuit), a microwave power amplifier, a millimeter wave power amplifier, and a high frequency MEMS device.

REFERENCE SIGNS LIST

10: Substrate;
12: Nitride based compound semiconductor layer (GaN layer);
14: Aluminum gallium nitride layer ($Al_xGa_{1-x}N$) (where $0.1<=x<=1$);
20: Source electrode;
20a: Source electrode contact;
24: Gate electrode;
25 and 34: Isolation region;
22: Drain electrode;
22a: Drain electrode contact;
28, 28a, 28b, 28c, 38a, and 38b: Trench region;
30: Insulating layer;
200: Source terminal electrode;
220: Drain terminal electrode;
240: Gate terminal electrode;
260: VIA hole;
AA: Active area; and
NA: Non-active area.

The invention claimed is:

1. A nitride based semiconductor device comprising:
a substrate;
a nitride based compound semiconductor layer placed on the substrate;
an active area which is placed on the nitride based compound semiconductor layer, and is composed of an aluminum gallium nitride layer ($Al_xGa_{1-x}N$) (where $0.1<=x<=1$);
an isolation region which performs isolation of the active area;
a trench region formed by etching a part of the active area directly under a gate electrode subsequently to be disposed on the active area; and
the gate electrode, a source electrode, and a drain electrode which are placed on the active area surrounded by the isolation region, wherein
the trench region is formed including a part of the active area directly under the gate electrode, in a tip region of said gate electrode.

2. The nitride based semiconductor device according to claim 1, wherein
the isolation region is formed to a part of depth direction of the aluminum gallium nitride layer ($Al_xGa_{1-x}N$) (where $0.1<=x<=1$) and the nitride based compound semiconductor layer.

3. The nitride based semiconductor device according to claim 1 further comprising:
a gate terminal electrode which is connected to the gate electrode and is placed on the isolation region, wherein
the trench region is formed including a part of the active area between the gate electrode and the gate terminal electrode.

4. The nitride based semiconductor device according to claim 1, wherein
the isolation region is formed by ion implantation.

5. The nitride based semiconductor device according to claim 1, wherein
the gate electrode, the source electrode, and the drain electrode comprises a plurality of fingers, respectively, and
the nitride based semiconductor device further comprises a gate terminal electrode, a source terminal electrode, and a drain terminal electrode which are placed on the first surface of the substrate, govern a plurality of fingers, respectively and are formed for every the gate electrode, the source electrode, and the drain electrode.

6. A fabrication method for a nitride based semiconductor device comprising:
forming a nitride based compound semiconductor layer on a substrate;
forming an active area composed of an aluminum gallium nitride layer ($Al_xGa_{1-x}N$) (where $0.1<=x<=1$) on the nitride based compound semiconductor layer;

forming an isolation region which performs isolation of the active area;

etching a part of the active area to form a trench region directly under a gate electrode subsequently to be disposed on the active area; and forming the gate electrode, a source electrode, and a drain electrode on the active area surrounded by the isolation region, wherein in the step of forming the trench region, the trench region is formed including the a part of active area directly under the gate electrode, in a tip region of the gate electrode.

7. The fabrication method for the nitride based semiconductor device according to claim 6, wherein in the step of forming the isolation region, the isolation region is formed to a part of depth direction of the aluminum gallium nitride layer ($Al_xGa_{1-x}N$) (where $0.1<=x<=1$) and the nitride based compound semiconductor layer.

8. The fabrication method for the nitride based semiconductor device according to claim 6 further comprising:

forming a gate terminal electrode connected to said gate electrode on the isolation region, wherein the trench region is formed including a part of the active area between the gate electrode and the gate terminal electrode.

* * * * *